(12) United States Patent
Talledo

(10) Patent No.: US 11,897,763 B2
(45) Date of Patent: Feb. 13, 2024

(54) CAPLESS SEMICONDUCTOR PACKAGE WITH A MICRO-ELECTROMECHANICAL SYSTEM (MEMS)

(71) Applicant: STMICROELECTRONICS, INC., Calamba (PH)

(72) Inventor: Jefferson Sismundo Talledo, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 203 days.

(21) Appl. No.: 17/103,796

(22) Filed: Nov. 24, 2020

(65) Prior Publication Data

US 2021/0179423 A1 Jun. 17, 2021

Related U.S. Application Data

(60) Provisional application No. 62/948,648, filed on Dec. 16, 2019.

(51) Int. Cl.
*B81C 1/00* (2006.01)
*B81B 7/00* (2006.01)

(52) U.S. Cl.
CPC ........ *B81C 1/00309* (2013.01); *B81B 7/0061* (2013.01); *B81B 2201/0264* (2013.01); *B81B 2201/0278* (2013.01); *B81B 2207/012* (2013.01); *B81B 2207/07* (2013.01); *B81C 2201/0108* (2013.01); *B81C 2201/0143* (2013.01); *B81C 2201/0146* (2013.01)

(58) Field of Classification Search
CPC ........ B81C 1/00309; B81C 2201/0108; B81C 2201/0143; B81C 2201/0146; B81C 2203/0154; B81C 1/00261; B81B 7/0061; B81B 2201/0264; B81B 2201/0278; B81B 2207/012; B81B 2207/07; B81B 2201/0257; B81B 2203/0315; B81B 7/0032; B81B 7/02
See application file for complete search history.

(56) References Cited

U.S. PATENT DOCUMENTS

| 7,482,193 B2 | 1/2009 | DCamp et al. |
| 7,875,942 B2 | 1/2011 | Cortese et al. |
| 7,898,043 B2 * | 3/2011 | Ziglioli ................. B81B 7/007 257/415 |

(Continued)

OTHER PUBLICATIONS

"Recommendations for Board Assembly of Infineon Leadless MEMS Packages with Open Sensor Port," *Infineon Technologies AG*, Edition Oct. 23, 2018, Revision 4.0, (18 pages).

*Primary Examiner* — Yasser A Abdelaziez
(74) *Attorney, Agent, or Firm* — Seed IP Law Group LLP

(57) ABSTRACT

A semiconductor package that contains an application-specific integrated circuit (ASIC) die and a micro-electromechanical system (MEMS) die. The MEMS die and the ASIC die are coupled to a substrate that includes an opening that extends through the substrate and is in fluid communication with an air cavity positioned between and separating the MEMS die from the substrate. The opening exposes the air cavity to an external environment and, following this, the air cavity exposes a MEMS element of the MEMS die to the external environment. The air cavity separating the MEMS die from the substrate is formed with a method of manufacturing that utilizes a thermally decomposable die attach material.

21 Claims, 5 Drawing Sheets

(56) References Cited

U.S. PATENT DOCUMENTS

| | | | | |
|---|---|---|---|---|
| 9,013,011 B1* | 4/2015 | Kuo | ............ | H01L 27/04 |
| | | | | 257/50 |
| 9,475,691 B1 | 10/2016 | Chua et al. | | |
| 11,128,959 B2* | 9/2021 | Rombach | ............ | H04R 19/04 |
| 2009/0218668 A1* | 9/2009 | Zhe | ............ | B81C 1/00309 |
| | | | | 257/E23.18 |
| 2012/0181639 A1* | 7/2012 | Ehrenpfordt | ............ | B81B 7/0061 |
| | | | | 438/51 |
| 2012/0280335 A1* | 11/2012 | Zoellin | ............ | B81B 3/00 |
| | | | | 257/416 |
| 2013/0032936 A1* | 2/2013 | Formosa | ............ | B81B 7/0074 |
| | | | | 438/51 |
| 2013/0194013 A1* | 8/2013 | Kwak | ............ | H03L 7/08 |
| | | | | 327/158 |
| 2015/0001646 A1 | 1/2015 | Mueller et al. | | |
| 2016/0046483 A1 | 2/2016 | Cheng et al. | | |
| 2017/0156002 A1 | 6/2017 | Han et al. | | |
| 2017/0284880 A1 | 10/2017 | Beer et al. | | |
| 2018/0148322 A1 | 5/2018 | Maier et al. | | |
| 2020/0270122 A1* | 8/2020 | Shelton | ............ | B06B 1/0677 |

* cited by examiner

CAPLESS SEMICONDUCTOR PACKAGE WITH A MICRO-ELECTROMECHANICAL SYSTEM (MEMS)

BACKGROUND

Technical Field

The present disclosure relates to a micro-electromechanical system (MEMS) sensor that is exposed to the external environment.

Description of the Related Art

Many semiconductor packages having a micro-electromechanical system (MEMS) die include a cavity that exposes a sensor component of the MEMS die to an external environment. The sensor component monitors a physical quantity or quality of the external environment outside of the package. Such semiconductor packages are typically formed using a rigid cap that is glued to a substrate on which the MEMS die is positioned. The cap is shaped to form the cavity between the MEMS die and the cap and includes an opening or hole that exposes the cavity to the external environment. This opening and cavity expose the sensor component of the MEMS die to the external environment. For example, the sensor component may monitor pressure, temperature, sound, light, or some other quantity, quality, or combination of quantities and qualities of the external environment to which the sensor component is exposed.

There is a large and expanding market for semiconductor packages having a MEMS sensor to monitor a greater number of physical quantities and qualities of the external environment, an environment of an electronic device, an input from a user, or any other physical quantity or quality desired to be monitored. However, there are significant challenges in reducing the manufacturing cost, size, footprint, and thickness of the semiconductor packages; and providing semiconductor packages that perform increasingly complex functions. Examples of electronic devices include laptops, displays, televisions, smart phones, tablets, computers, bendable electronic devices, or any other electronic device that may benefit from monitoring of physical quantities or qualities of the external environment.

One significant challenge is producing a semiconductor package with a MEMS die that is decreased in size, decreased in footprint and profile, and decreased in thickness, while maintaining the MEMS die's capability of monitoring physical quantities and qualities of the external environment. As a semiconductor package with a MEMS die is reduced in size, footprint, profile, and thickness, it becomes more difficult to provide a cap with sufficient clearance to avoid failure in the sensor component of the MEMS die while exposing the sensor component of the MEMS die to the external environment for monitoring.

Another significant challenge is reducing the cost of producing a semiconductor package with a MEMS die. As the number of components and materials used in the semiconductor package increases, the cost of manufacturing the semiconductor package with the MEMS die increases and the number of manufacturing steps increases. For example, forming a semiconductor package with a cap to protect the MEMS die includes manufacturing the cap, placing the cap in the correct position using a high-accuracy cap attach machine, and attaching the cap to the substrate using an adhesive. Also, making such semiconductor packages smaller by making a smaller cap would be expensive because it would include manufacturing a new high-accuracy cap attach machine to handle the smaller cap and place the cap in the correct position due to small offsets and clearances and low levels of allowed tolerance in the positioning of the cap.

BRIEF SUMMARY

In view of the list of significant challenges above, which is not a complete list, it is desirable to provide a semiconductor package with a micro-electromechanical system (MEMS) die that does not require a cap to protect the MEMS die or expose the MEMS die to an external environment, has a smaller thickness and a smaller size, does not require as many manufacturing steps, and allows greater tolerances for variation when manufacturing the semiconductor package, thereby increasing the yield of usable semiconductor packages formed.

The present disclosure is directed to various embodiments of a semiconductor package that contains a MEMS die and that does not require the use of a cap glued to a substrate. In other words, the semiconductor package is a capless semiconductor package.

According to one embodiment of a semiconductor package containing a MEMS die, a molding compound covers sidewalls and surfaces of the MEMS die and is directly in contact with the sidewalls and surface of the MEMS die such that the MEMS die is held in place within the semiconductor package. The MEMS die is exposed to an external environment through an opening formed in a substrate and an air cavity that is positioned between the substrate and a sensor component of the MEMS die. This semiconductor package may be referred to as a capless semiconductor package. The MEMS die is electrically coupled to a substrate of the semiconductor package by a bonding wire.

In this embodiment, the molding compound acts in a similar fashion that a cap would normally act if a cap were utilized to protect and expose a sensor component of a MEMS die to an external environment. However, by removing the necessity to include a cap, the manufacturing cost of producing a semiconductor package with a MEMS die is reduced, the yield of the number of usable and functioning semiconductor packages with MEMS die is increased, and the overall thickness of semiconductor packages with MEMS die is reduced. The cost is reduced and the yield is increased because a high-accuracy cap attach machine is not required to place the cap, the cap does not have to be manufactured, and standard strip molding processes and materials can be utilized to form the semiconductor package to protect the MEMS die.

According to an alternative embodiment of a semiconductor package containing a MEMS die, a molding compound covers sidewalls of the MEMS die and a surface of the MEMS die is flush and co-planar with a surface of the molding compound. The surface of the MEMS die flush and co-planar with the surface of the molding compound is exposed to an external environment. The MEMS die is electrically coupled to the substrate by solder balls that are positioned within an air cavity separating the MEMS die from the substrate.

According to another alternative embodiment of a semiconductor package containing a MEMS die, a molding compound covers sidewalls and a surface of the MEMS die that is facing away from the substrate. The MEMS die is electrically coupled to the substrate by solder balls that are positioned within an air cavity separating the MEMS die from the substrate.

According to a method of manufacturing of the above embodiment and alternative embodiments of a semiconductor package containing a MEMS die, the MEMS die is coupled to a substrate by a sacrificial material. The sacrificial material is a thermally decomposable die attach that is removed by exposing the thermally decomposable die attach to heat. The method of manufacturing also includes forming an opening in the substrate that is aligned with both a sensor component of the MEMS die and the air cavity separating the MEMS die from the substrate.

BRIEF DESCRIPTION OF THE SEVERAL VIEWS OF THE DRAWINGS

In the drawings, identical reference numbers identify similar elements or acts unless the context indicates otherwise. The sizes and relative portions of the elements in the drawings are not necessarily drawn to scale.

DETAILED DESCRIPTION

Figure 1A:
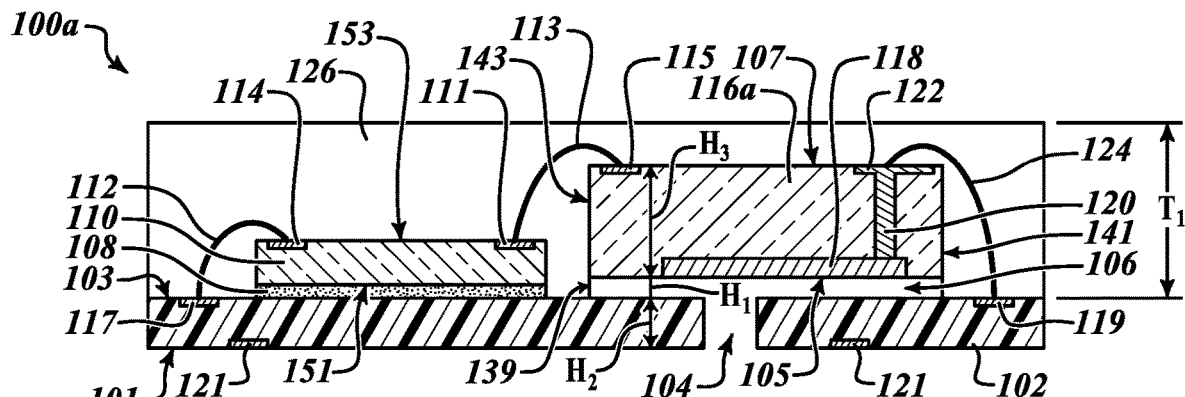
FIG. 1A is directed to a cross-sectional view of an embodiment of a semiconductor package containing a micro-electromechanical system (MEMS) die and an applied specific integrated circuit (ASIC) die.

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in this specification and the appended claims, the terms "top" and "bottom" refer to the orientation of surfaces of semiconductor packages when viewed in the Figures. The terms "top" and "bottom" do not limit the surfaces of the semiconductor packages in the Figures to the specific orientation of the semiconductor packages as disclosed in the Figures.

As used in the specification and the appended claims, the terms "left" and "right" refer to the orientation of surfaces of a semiconductor package when viewed in the Figures. The terms "left" and "right" do not limit the surfaces of the semiconductor package in the Figures to the specific orientation of the semiconductor packages disclosed in the Figures.

The present disclosure is directed to various embodiments of a semiconductor package containing a MEMS die that includes an air cavity, which may be referred to as a space, a cavity, and an opening, that separates the MEMS die from a substrate of the semiconductor package and exposes a sensor component or MEMS element of the MEMS die to an external environment. A molding compound or encapsulant of the semiconductor package is around the MEMS die and is in direct contact with the MEMS die to hold the MEMS die within the semiconductor package and protect the MEMS die.

FIG. 1A is directed to a cross-sectional view of an embodiment of a semiconductor package 100a. The semiconductor package 100a includes a substrate 102 on one side of the semiconductor package 100a. The substrate 102 includes an insulating polymeric core and conductive connections, conductive contacts, and conductive vias that are on or in the insulating polymeric core. The conductive connections, the conductive contacts, and the conductive vias are utilized for supplying signals and power to a die 110, 116a in the semiconductor package 100a. For example, the die may be an applied specific integrated circuit (ASIC) die 110 or a micro-electromechanical system (MEMS) die 116a that are electrically coupled to the conductive connections, the conductive contacts, and the conductive vias of the substrate 102 of the semiconductor package 100a.

The MEMS die 116a includes a sensor element 118, which may be a pressure sensor, a temperature sensor, a sound sensor, or any other type of MEMS sensor. The sensor element 118 in FIG. 1A is a place holder for any structure for a sensor element 118 of the MEMS die 116a. For example, structures of the sensor element 118 of the MEMS die 116a will be discussed in greater detail with respect to possible structures of a sensor element of a MEMS die 116b, 116c in FIGS. 1B and 1C.

In this embodiment, the ASIC die 110 and the MEMS die 116a are coupled to a surface of the substrate 102. This surface of the substrate 102 includes a first contact pad 117 coupled to the ASIC die 110 and a second contact pad 119 coupled to the MEMS die 116a through respective bonding wires 112, 124. A bottom surface 101 of the substrate 102 faces away from the MEMS die 116a and the ASIC die 110. The bottom surface 101 of the substrate 102 includes a plurality of contact pads 121 that are electrically coupled to the first contact pad 117 and the second contact pad 119 through conductive vias or other connectors in the substrate 102 as discussed above, which are not shown in the Figures for simplicity.

The ASIC die 110 is coupled to the substrate by an adhesive or a coupling material 108, which may be a conductive adhesive, a non-conductive adhesive, a die attach film, or any other material utilized for attaching a die to a substrate. The adhesive or coupling material 108 is coupled to a bottom surface 151 of the ASIC die 110 and the top surface 103 of the substrate 102. A top surface 153 of the ASIC die 110 includes a contact pad 114 coupled to active and passive components in the substrate 102 by a bonding wire 112, and a contact pad 111 coupled to a contact pad 115 of the MEMS die 116a by another bonding wire 113. The bottom surface 151 of the ASIC die 110 faces the top surface 103 of the substrate 102 and the top surface 153 of the ASIC die 110 faces away from the top surface 103 of the substrate 102.

The bonding wire 112 coupling the ASIC die 110 to the substrate 102 includes an end coupled to the contact pad 114 and an end coupled to active or passive components within the substrate 102 through the contact pad 117. The bonding wire 112 allows electrical signals and power to be supplied to the ASIC die 110 from other electrical components as discussed earlier. The bonding wire allows electrical signals to be sent by the ASIC die 110 to other electrical components. These electrical signals may be instruction signals, control signals, data signals, or any other types of electrical signals for communicating information between electrical components within an electronic device.

Similarly, the bonding wire 113 coupling the contact pad 111 of the ASIC die 110 to the contact pad 115 of the MEMS die 116a includes an end coupled to the contact pad 111 of the ASIC die 110 and an end coupled to the contact pad 115 of the MEMS die 116a. The bonding wire 113 allows electrical signals to be transmitted from the ASIC die 110 to the MEMS die 116a, and vice versa. These electrical signals may be instruction signals, control signals, data signals, or any other types of electrical signals for communicating information between electrical components. The contact pad 115 may be coupled to the sensor element 118 of the MEMS die 116a through a conductive connection such as a conductive via.

The MEMS die 116a includes a contact pad 122 that is coupled to a conductive via 120 and a bonding wire 124. The conductive via 120 extends through the MEMS die 116a from the contact pad 122 to a sensor element 118 and couples the contact pad 122 to the sensor element 118.

The contact pad 122 of the MEMS die 116a is coupled to an end of the bonding wire 124 and another end of the bonding wire 124 is coupled to the second contact pad 119 in the substrate 102. The bonding wire 124 transmits electrical signals from the MEMS die 116a to external electrical components and transmits electrical signals from external electrical components to the MEMS die 116a. These electrical signals may be instruction signals, control signals, data signals, or any other types of electrical signals for communicating information between electrical components.

The semiconductor package 100a includes an air cavity 106, which may be referred to as a space, an opening, or a cavity. The air cavity 106 is positioned between a bottom surface 105 of the MEMS die 116a, which includes the sensor element 118, and a top surface 103 of the substrate 102 facing the MEMS die 116a. The air cavity 106 separates the bottom surface 105 of the MEMS die 116a and the top surface 103 of the substrate 102.

The air cavity 106 is in fluid communication and is aligned with an opening 104 that extends through the substrate 102. The opening 104 may be circular, rectangular, square, triangular, or any other shape as desired. The opening 104 in the substrate allows the air cavity 106 to be exposed to the external environment and allows the sensor element 118 to be exposed to the external environment. The sensor element 118 monitors a physical quantity or quality of the external environment such as pressure, temperature, sound, or any other quantity or quality of the external environment as desired.

The air cavity 106 extends from a first sidewall 141 of the MEMS die 116a to a second sidewall 143 of the MEMS die 116a. In other words, in this embodiment, the air cavity 106 has a width that is substantially equal to a width of the MEMS die 116a. The air cavity 106 has a width that is substantially equal to the width of the MEMS die 116a because the air cavity may be slightly larger or slightly smaller when the semiconductor package is manufactured in a manner to produce an air cavity with a width equal to a width of a MEMS die. This understanding of the use of "substantially," will also apply to other similar uses of the word "substantially" in the present disclosure.

In alternative embodiments, an air cavity positioned between and separating a MEMS die from a substrate may extend past sidewalls of the MEMS die and have a width that is greater than a width of the MEMS die, or have a width that is less than the width of the MEMS die.

In this embodiment of the semiconductor package 100a, the sensor element 118 is aligned with the opening 104 in this substrate 102. However, in alternative embodiments of a semiconductor package, a MEMS element of a MEMS die may not be aligned with an opening that extends through the substrate. Instead, in alternative embodiments of a semiconductor package, a MEMS element of a MEMS die may be offset from an opening that extends through a substrate.

In this embodiment, a molding compound 126 covers a top surface 107 of the MEMS die 116a, which includes the contact pads 115, 122, and covers the sidewalls 141, 143 of the MEMS die 116a. The bottom surface 105 of the MEMS die 116a that the sensor element 118 is on is left exposed. The sensor element 118 is exposed to the external environment through the air cavity 106 and the opening 104 in the substrate 102 because the air cavity 106 and the opening 104 in the substrate 102 are in fluid communication.

The molding compound 126 may be an encapsulant material, an insulating material, or some other combination of materials. The direct contact of the molding compound 126 with the sidewalls 141, 143 of the MEMS die 116a holds the MEMS die 116a in position within the semiconductor package 100a such that the air cavity 106 separates the MEMS die 116a from the substrate 102. In other words, the MEMS die 116a is not in physical contact with the substrate 102.

In this embodiment, the air cavity 106 has a height $H_1$ that is less than a height $H_2$ of the substrate 102. However, in alternative embodiments, an air cavity between a MEMS die and a substrate may have a height that is greater than a height of the substrate. In another alternative embodiment, an air cavity between a MEMS die and a substrate may have a height that is substantially equal to a height of the substrate.

In this embodiment, the molding compound 126 has a thickness $T_1$ that extends from the surface of the substrate 102 that faces the MEMS die 116a and the ASIC die 110 to the surface of the molding compound 126 that faces away from the substrate 102. The air cavity 106 has a height $H_1$ that is less than a height $H_2$ of the opening 104 that extends through the substrate 102. The MEMS die 116a has a height $H_3$. The addition of the height $H_1$ of the air cavity 106 and the height $H_3$ of the MEMS die 116a is less than the thickness $T_1$ of the molding compound 126.

Figure 1B:
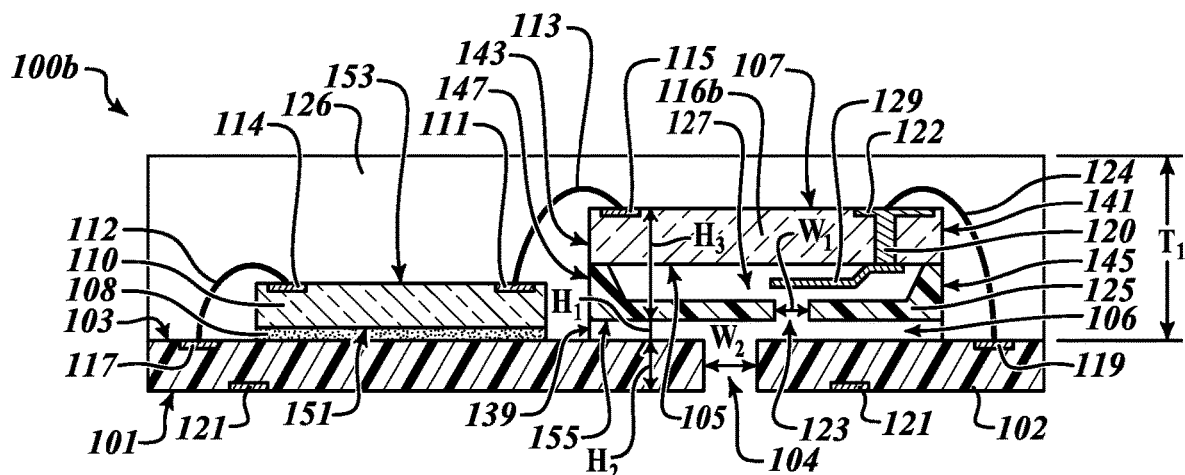
FIG. 1B is a cross-sectional view of an alternative embodiment of a semiconductor package containing a MEMS die and an ASIC die.
Figure 1C:
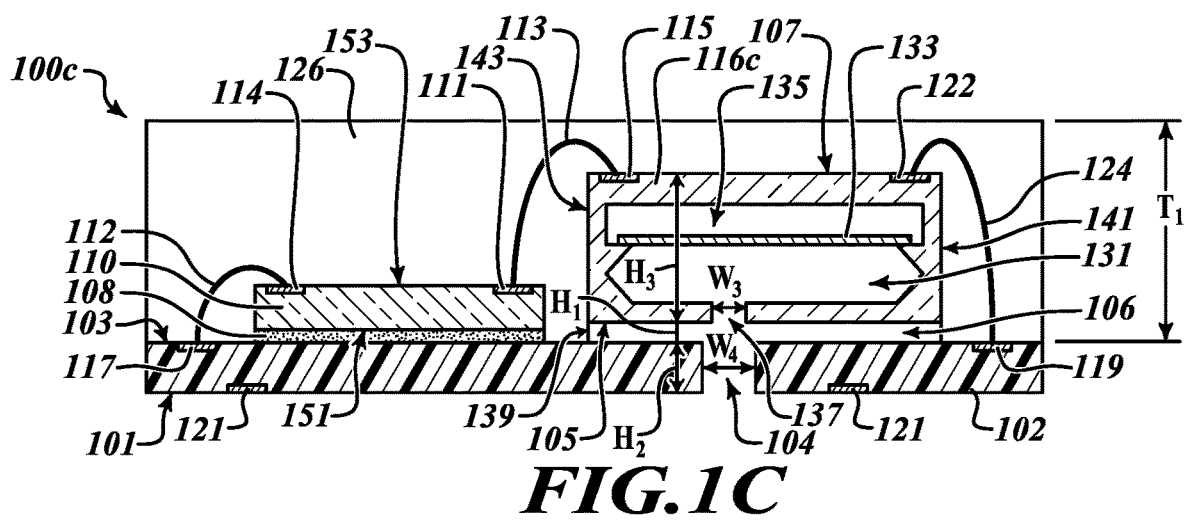
FIG. 1C is a cross-sectional view of an alternative embodiment of a semiconductor package containing a MEMS die and an ASIC die.

Semiconductor packages 100b, 100c according to alternate embodiments are illustrated in FIGS. 1B and 1C. The semiconductor packages 100b, 100c include similar features as discussed above with respect to the semiconductor package 100a in FIG. 1A and reference numbers may be repeated for the sake of simplicity and brevity. In addition, only different details in these alternative embodiments of semiconductor packages 100b, 100c will be discussed for the sake of simplicity and brevity. However, the alternative embodiments provide possible structures that may be incorporated into the MEMS die 116a in FIG. 1A as for the sensor element 118, which is a place holder for a more complex structure of the sensor element 118.

FIG. 1B is directed to a cross-sectional view of the semiconductor package 100b containing a MEMS die 116b and an ASIC die 110. The semiconductor package 100b includes several features that are similar to those in the semiconductor package 100a in FIG. 1A. However, in the semiconductor package 100b, a sensor component 129 is shown on a surface of the MEMS die 116b. The sensor component 129, which is a cantilever pressure sensor, senses pressure of the external environment. The sensor component 129 may be electrically coupled to the conductive via 120, the contact pad 122, and the bonding wire 124 that is coupled to the second contact pad 119 of the substrate 102. While the sensor component 129 is shown as only being a cantilever beam pressure sensor for simplicity, the sensor component 129 may include a number of electrical contacts, a cavity in the MEMS die 116b that is aligned with the cantilever beam, and other active and passive components.

A cap 125 is coupled to a surface of the MEMS die 116b that faces towards the substrate 102. The cap overlays the sensor component 129 of the MEMS die 116b and forms a cavity 127 that surrounds the sensor component 129 of the MEMS die 116b. The cap 125 further includes an opening 123 that extends through the cap 125 that exposes the sensor component 129 to the external environment. The opening 123 of the cap 125 is in fluid communication with the air cavity 106 that is positioned between the cap 125 and the substrate 102, and the air cavity 106 is in fluid communication with the opening 104 that extends through the substrate 102.

In this alternative embodiment, the molding compound 126 covers the sidewalls 141, 143 of the MEMS die 116b, a top surface 107 of the MEMS die 116b that faces away from the substrate 102, and sidewalls 145, 147 of the cap 125. Similar to the molding compound 126 in the semiconductor package 100a, the molding compound 126 in the semiconductor package 100b is in direct contact with the sidewalls 141, 143 of the MEMS die 116b and the sidewalls 145, 147 of the cap 125 such that the air cavity 106 separates the MEMS die 116b and the cap 125 from the substrate 102. In other words, the cap 125 of the MEMS die 116b is not in physical contact with the substrate 102.

In the semiconductor package 100b, the cap 125 is on and coupled to the bottom surface 105 of the MEMS die 116b. The bottom surface 105 faces the top surface 103 of the substrate 102. The cap 125 has a bottom surface 155 that faces the top surface 103 of the substrate 102. The bottom surface 155 of the cap 125 is spaced apart from the top surface 103 of the substrate 102 by the air cavity 106.

In the semiconductor package 100b, the opening 123 in the cap 125 is offset from the opening 104 that extends through the substrate 102. However, in other alternative embodiments, the opening 123 in the cap 125 may be aligned with the opening 104 in the substrate 102.

The opening 123 in the cap 125 has a width $W_1$ that is less than a width $W_2$ of the opening 104 that is in the substrate 102. However, in other alternative embodiments, the width $W_1$ of the opening 123 in the cap 125 may be greater than or equal to the width $W_2$ of the opening 104 in the substrate 102.

In the semiconductor package 100b, the cap 125 and the sensor component 129 may be incorporated in the semiconductor package 100a in FIG. 1A where the sensor element 118 is positioned in FIG. 1A. In other words, the structure of the cap 125 and the sensor component 129 may be the sensor element 118 in the semiconductor package 100a. However, in other alternative embodiments of a semiconductor package, the sensor element 118 may have a different structure. For example, the structure of a sensor component 133 of the MEMS die 116c in FIG. 1C is different.

FIG. 1C is directed to a cross-sectional view of the semiconductor package 100c containing the MEMS die 116c and the ASIC die 110. The semiconductor package 100c includes several features that are similar to those in the semiconductor packages 100a, 100b in FIGS. 1A-1B. However, in this alternative embodiment of the semiconductor package 100c, the sensor component 133 is a thin membrane that detects sounds or vibrations.

The MEMS die 116c includes a first internal cavity 131 on a first side of the sensor component 133 and a second internal cavity 135 that is on a second side of the sensor component 133 opposite to the first side of the sensor component 133. The sensor component 133 separates the first internal cavity 131 from the second internal cavity 135 of the MEMS die 116c. An opening 137 extends into the MEMS die 116c and is in fluid communication with the first internal cavity 131, the air cavity 106 that separates the MEMS die 116c from the substrate 102, and the opening 104 that extends through the substrate 102. Accordingly, the opening 104, air cavity 106, and first internal cavity 131 expose the sensor component 133 of the MEMS die 116c to the external environment.

In this alternative embodiment of the semiconductor package 100c, the opening 137 in the MEMS die 116c has a width $W_3$ that is less than a width $W_4$ of the opening 104 that is in the substrate 102. However, in other alternative embodiments, the width $W_3$ of the opening 123 in the cap 125 may be greater than or equal to the width $W_4$ of the opening 104 in the substrate 102.

In the semiconductor package 100c, the opening 137 is aligned with the opening 104 in the substrate 102. However, in other alternative embodiments, the opening 137 may be offset from the opening 104.

In the semiconductor package 100c, the molding compound 126 covers the top surface 103 and sidewalls 141, 143 of the MEMS die 116c. The direct contact of the molding compound 126 with the sidewalls 141, 143 of the MEMS die 116c holds the MEMS die 116c in position within the semiconductor package 100a such that the air cavity 106 separates the MEMS die 116c from the substrate 102. In other words, the MEMS die 116c is not in physical contact with the substrate 102.

In the semiconductor package 100c, the first internal cavity 131, the sensor component 133, and the second internal cavity 135 correspond to the sensor element 118 in the semiconductor package 100a. However, in other alternative embodiments of a semiconductor package, the sensor element 118 may have a different structure. Accordingly, the sensor element 118 in FIG. 1A can have any desired structure for monitoring a quality or physical quantity of an external environment such as pressure, temperature, sound, light, or any other quality or quantity of an external environment as desired, and is not simply limited to those structures described in FIGS. 1B-1C.

In the semiconductor packages 100a, 100b, 100c in FIGS. 1A-1C, a plurality of walls 139 of the molding compound 126 are flush with the plurality of sidewalls 141, 143 of the MEMS die 116a, 116b, 116c. The walls 139 of the molding compound 126 are around the air cavity 106. However, in alternative embodiments of semiconductor packages, the walls 139 may not be flush or co-planar with the plurality of sidewalls 141, 143 of the MEMS die 116a, 116b, 116c of a semiconductor package. Instead or in addition, a portion of the molding compound 126 may be on the bottom surface 105 of the MEMS die 116a, 116b, 116c facing the substrate 102, or the walls 139 may be positioned inwardly from the plurality of sidewalls 141, 143 of the MEMS die 116a, 116b, 116c. Alternatively, the walls 139 could be spaced apart from the plurality of sidewalls 141, 143 of the MEMS die 116a, 116b, 116c to give the air cavity 106 a width greater than the MEMS die 116a, 116b, 116c.

Figure 2A:
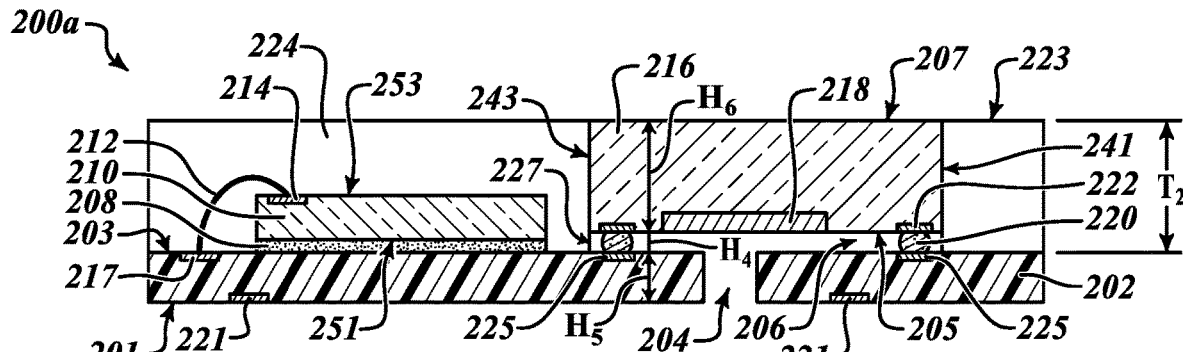
FIG. 2A is directed to a cross-sectional view of an alternative embodiment of a semiconductor package containing a MEMS die and an ASIC die.

FIG. 2A is a cross-sectional view of a semiconductor package 200a that contains a MEMS die 216 and an ASIC die 210, according to an alternate embodiment. The ASIC die 210 and the MEMS die 216 are coupled to a top surface 203 of the substrate 202. The ASIC die 210 is coupled to the top surface 203 of the substrate 202 by an adhesive or coupling material 208 on a bottom surface 251 of the ASIC die 210, which may be a conductive adhesive, a non-conductive adhesive, a die attach film, or any other adhesive material as desired. The MEMS die 216 includes a sensor element 218.

The top surface 203 of the substrate 202 includes a first contact pad 217 that is coupled to a contact 214 on a top surface 253 of the ASIC die 210 by a bonding wire 212. Unlike the semiconductor packages 100a, 100b, 100c in FIGS. 1A-1C, the ASIC die 210 is in electrical communication with a MEMS die 216 through conductive elements in the substrate 202, which are not shown for simplicity. For example, the conductive elements in the substrate 202 may be conductive vias, conductive connectors, or some other conductive connection that couples. Alternatively, respective contact pads of a plurality of contact pads 221 on a bottom surface 201 of the substrate 202 that faces away from the ASIC die 210 and the MEMS die 216 are coupled to contact pads 217, 225 on a top surface 203 of the substrate 202 that faces the ASIC die 210 and the MEMS die 216. Alternatively, a respective contact pad 217 of the substrate 202 coupled to the ASIC and a respective contact pad of a plurality of contact pads 225 of the substrate 202 coupled to the MEMS die 216 may be electrically coupled to each other by conductive elements within the substrate 202, which again are not shown for simplicity.

The plurality of contact pads 225 on the substrate 202 are coupled to a plurality of contact pads 222 on a bottom surface 205 of the MEMS die 216. The bottom surface 205 of the MEMS die 216 faces the top surface 203 of the substrate 202. Each contact pad of the plurality of contact pads 222 of the MEMS die 216 is aligned with and coupled to a respective contact pad 225 of the substrate 202. The contact pads 222 of the MEMS die 216 are coupled to the contact pads 225 of the substrate 202 by solder balls 220 that are present within an air cavity 206 that separates the substrate 202 from the MEMS die 216.

In this embodiment, the solder balls 220 are spaced apart from sidewalls 227 of the molding compound 224 that are flush with sidewalls 241, 243 of the MEMS die 216. The sidewalls 227 of the molding compound 224 are around the air cavity 206. However, in alternative embodiments of the semiconductor package 200a, the solder balls 220 may be in contact or cover these walls of the molding compound 224. Also, the solder balls 220 could be replaced by other known conductive connectors, such as pins and conductive adhesives.

In this embodiment, the molding compound has sidewalls 227 that are flush and co-planar with the sidewalls 241 of the MEMS die 216 similar to the walls 139 in FIGS. 1A-1C. However, in alternative embodiments, the molding compound 224 may extend onto the bottom surface 205 of the MEMS die 216 that faces the substrate 202, a portion of the molding compound 224 may be on the bottom surface 205 of the MEMS die 216, or the walls 139 may be positioned inwardly from the plurality of sidewalls 241 of the MEMS die 216. In another alternative embodiment, the sidewalls 227 may be positioned outwardly from the plurality of sidewalls 241, 243 of the MEMS die 216.

The air cavity 206 may be referred to as a space, an opening, or a cavity. The air cavity 206 is positioned between the bottom surface 205 of the MEMS die 216 that the sensor element 218 is on and a top surface 203 of the substrate 202 that is facing the MEMS die 216. The air cavity 206 separates the bottom surface 205 of the MEMS die 216 and the top surface 203 of the substrate 202.

An opening 204 extending through the substrate 202 is in fluid communication and is aligned with the air cavity 206. The opening 204 may be circular, rectangular, square, triangular, or any other shaped opening as desired. The opening 204 in the substrate 202 allows the air cavity 206 and the sensor element 218 to be exposed to the external environment.

The sensor element 218 monitors a quantity or quality of the external environment such as pressure, temperature, sound, or any other quantity or quality of the external environment as desired. The air cavity 206 extends from a first respective sidewall 241 of the MEMS die 216 to a second respective sidewall 241 of the MEMS die 216. In this embodiment, the air cavity 206 has a width that is substantially equal to a width to the MEMS die 216. However, in alternative embodiments, the air cavity 206 may extend past sidewalls of the MEMS die and have a width that is greater than a width of the MEMS die, or have a width that is less than the width of the MEMS die.

Unlike the semiconductor packages 100a, 100b, 100c in FIGS. 1A-1C, in this embodiment to the semiconductor package 200a in FIG. 2A, the MEMS die 216 has a top surface 207 that faces away from the substrate 202. The top surface 207 is flush or co-planar with a top surface 223 of a molding compound 224 that faces away from the substrate 202. This allows the semiconductor package 200a to be manufactured to be thinner than the semiconductor packages 100a, 100b, 100c in FIGS. 1A-1C.

In the semiconductor package 200a, the molding compound 224 has a thickness $T_2$ that extends from the top surface 203 of the substrate 202 to the top surface 223 of the molding compound 224 that faces away from the substrate 202. The air cavity 206 and the solder balls 220 have a height $H_4$ that is less than a height $H_5$ of the opening 204 that extends through the substrate 202. The MEMS die 216 has a height $H_6$. The height $H_4$ of the air cavity 206 and solder balls 220, the height $H_5$ of the opening 204, and the height $H_6$ of the MEMS die 216 are all less than the thickness $T_2$ of the molding compound 224. The addition of the height $H_4$ of the air cavity 206 and the solder balls 220 and the height $H_6$ of the MEMS die 216 is substantially equal to the thickness $T_2$ of the molding compound 224.

Figure 2B:
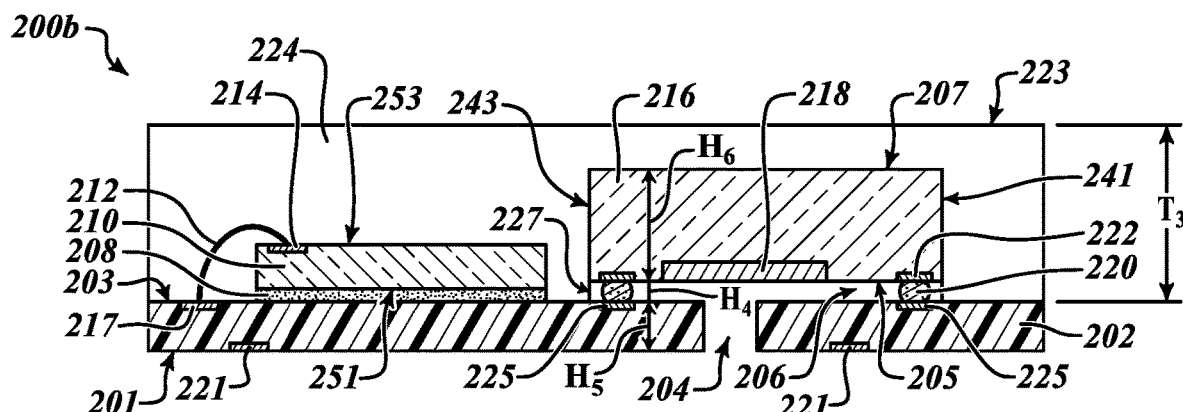
FIG. 2B is directed to a cross-sectional view of an alternative embodiment of a semiconductor package containing a MEMS die and an ASIC die.

FIG. 2B is directed to a semiconductor package 200b that is similar to the semiconductor package 200a. The features of the semiconductor package are the same, however, the molding compound 224 covers the plurality of sidewalls 241, 243 of the MEMS die 216, and covers the top surface 207 of the MEMS die 216. The molding compound 224 has a thickness $T_3$ that is greater than the addition of the height $H_4$ of the air cavity 206 and the height $H_6$ of the MEMS die 216.

Figure 3:
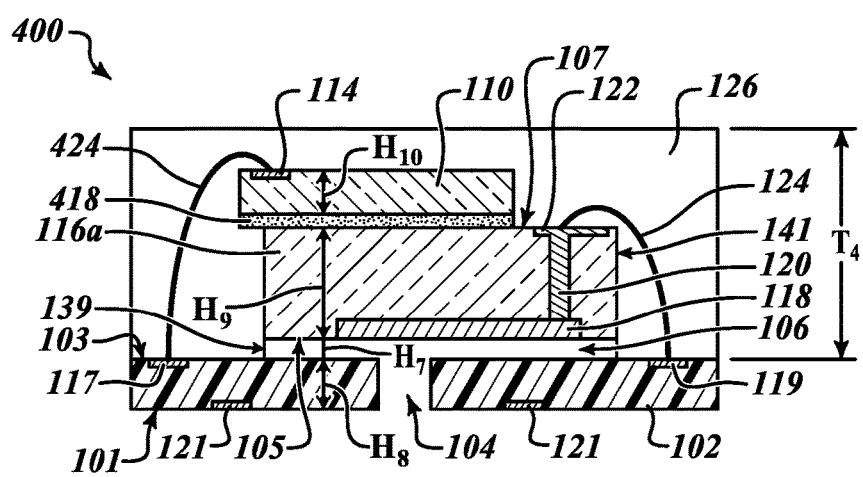
FIG. 3 is directed to a cross-sectional view of an alternative embodiment of a semiconductor package containing a MEMS die and an ASIC die.

FIG. 3 is a cross-sectional view of a semiconductor package 400. The features of the semiconductor package 400 are similar to those in the semiconductor package 100a in FIG. 1A and are provided similar reference numerals. However, in the semiconductor package 400, the ASIC die 110 is coupled to the top surface 107 of MEMS die 116a that faces away from the substrate 102 by an adhesive 418. The adhesive 418 may be a conductive adhesive, a non-conductive adhesive, or some other adhesive. For example, if the adhesive 418 is a conductive adhesive, the ASIC die 110 may be electrically coupled to the MEMS die 216 by the conductive adhesive.

In this embodiment, the air cavity 106 has a height $H_7$, and the substrate 102 and the opening 104 have a height $H_8$ that is greater than the height $H_7$ of the air cavity 106. In alternative embodiments, the height $H_7$ of the air cavity 106 may be greater than or equal to the height $H_8$ of the substrate 102.

The MEMS die 116a has a height $H_9$ and the ASIC die 110 has a height $H_{10}$. In this embodiment, the height $H_9$ of the MEMS die 116a is greater than the height $H_{10}$ of the ASIC die 110. In alternative embodiments, the height $H_9$ of a MEMS die 116a may be less than or equal to the height $H_{10}$ of the ASIC die 110.

The molding compound 126 has a thickness $T_4$ that extends from a top surface 103 of the substrate 102 that is facing the MEMS die 116a and the ASIC die 110. The thickness $T_4$ of the molding compound 126 is greater than the addition of the height $H_7$ of the air cavity 106, the height $H_9$ of the MEMS die 116a, and the height $H_{10}$ of the ASIC die 110. The molding compound 126 covers sidewalls 141, 143, which may be referred to as a right sidewall 141 and a left sidewall 143, of the MEMS die 116a and covers sidewalls 141, 143 of the ASIC die 110. The molding compound 126 holds the MEMS die 116a in a position that is spaced apart by the air cavity 106 from the substrate 102. In other words, the MEMS die 116a is not in physical contact with the substrate 102.

The ASIC die 110 includes the contact pad 114 that is coupled to a contact pad 117 on the top surface 103 of the substrate 102 that faces towards the MEMS die 116a and the ASIC die 110. Similar to the contact pad 119 of the substrate 102 that is coupled to the MEMS die 116a utilizing the bonding wire 124, the contact pad 117 of the substrate 102 is coupled to the contact pad 114 of the ASIC die 110 by a bonding wire 424. The contact pad 117 is coupled to at least one contact pad 121 of the plurality of contact pads 121.

In this embodiment of the semiconductor package 400 in FIG. 3, walls 139 of the molding compound 126 are flush with sidewalls 141, 143 of the MEMS die 116a. The walls 139 of the molding compound 126 are around the air cavity 106. However, in alternative embodiments of semiconductor packages, the walls 139 may not be flush or co-planar with the plurality of sidewalls 141, 143 of the MEMS die 116a of the semiconductor package 400. Instead, the walls 139 may be on the bottom surface 105 of the MEMS die 116a facing the substrate 102, a portion of the molding compound 126 may be on the bottom surface 105 of the MEMS die 116a, or the walls 139 may be positioned inwardly from the sidewalls 141, 143 of the MEMS die 116a. Alternatively, the sidewalls 141, 143 of the MEMS die 116a may be positioned closer to the opening 104 in the substrate 102 than the walls 139. In other words, the air cavity 106 may have a width greater than the MEMS die 116a, or the walls 139 may be positioned outwardly from the sidewalls 141, 143 of the MEMS die 116a.

These above embodiments of the semiconductor packages 100a, 100b, 100c, 200a, 200b, 400 are thinner than semiconductor packages that utilize a cap instead of a molding compound to protect an ASIC die and a MEMS die. The reason these semiconductor packages are thinner than a semiconductor package that utilizes a cap to protect an ASIC die and a MEMS die instead of a molding compound is because a space must be provided between the cap and dies to form bonding wires coupling the dies to a substrate. Instead, when utilizing a molding compound the molding compound can be formed more precisely such that the molding compound has an overall height that is less than the cap and still provide protection for the bonding wires because the molding compound reinforces the bonding wires. Similarly, if a MEMS die is coupled to a substrate using solder balls similar to the semiconductor packages disclosed in FIGS. 2A-2B, the packages can be made even thinner than utilizing a cap because a surface of the MEMS die can be made flush with a surface of the molding compound, which would be extremely difficult to accomplish utilizing a cap to protect the MEMS die instead. The molding compound surrounds the dice and provides reinforcement unlike a cap as well.

FIGS. 4A-4E are directed to a flowchart for a method of manufacturing the semiconductor packages discussed above. Specifically, FIGS. 4A-4E depict the method of manufacturing for the semiconductor package 100a in FIG. 1A.

Figure 4A:
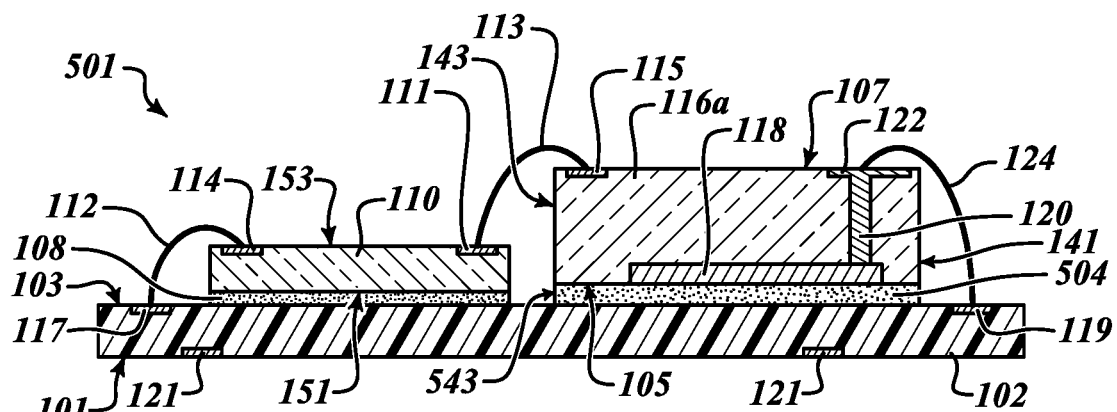
FIGS. 4A-4E are directed to an embodiment of a method of manufacturing an embodiment of a semiconductor package containing a MEMS die and an ASIC die.

A first step 501 illustrated in FIG. 4A includes coupling a MEMS die 116a and an ASIC die 110 to a substrate 102. The MEMS die 116a is coupled to the top surface of the substrate 102 by an adhesive or coupling material 504. In this embodiment, the adhesive or coupling material 504 is a thermally decomposable die attach, thermally decomposable adhesive, thermally decomposable die attach material, or thermally decomposable coupling material. Alternatively the adhesive or coupling material 504 could be other known sacrificial materials. The thermally decomposable die attach 504 covers a surface of the MEMS die 116a including a sensor element 118. The sensor element 118 is covered by the thermally decomposable die attach 504. The sensor element 118 faces towards the substrate 102.

The thermally decomposable die attach 504 includes sidewalls 543. In this embodiment, the sidewalls 543 of the thermally decomposable die attach 504 are co-planar or flush with the sidewalls 141, 143 of the MEMS die 116a.

However, in alternative embodiments, the sidewalls 543 of the thermally decomposable die attach 504 may extend outward from the sidewalls 141, 143 of the MEMS die 116a, may extend inwards from the sidewalls 141, 143 of the MEMS die 116a, or may extend outwardly or inwardly in any combination as desired.

The thermally decomposable die attach 504 may be a tetracyclododecene-based sacrificial polymer (TD) material; a polycarbonate material such as polyethylene carbonate (PEC), polypropylene carbonate (PPC), polycyclohexene carbonate (PCC), copolymer of polypropylene carbonate (PPC) and polycyclohexene carbonate (PCC); a polyoxymethylene (POM) or acetal material; a polynorbornene (PNB) material; a parylene material; or any other thermally decomposable die attach material as desired. However, these thermally decomposable materials are preferred to couple the MEMS die 116a to the top surface 103 of the substrate 102 facing the MEMS die 116a because these materials can be removed by a heat or temperature generally produced by a reflow oven, which will be discussed in greater detail with respect to FIG. 4E. The temperature range for decomposing the thermally decomposable die attach 504 is from 240 to 300 degrees Celsius.

After the MEMS die 116a is coupled to the top surface 103 of the substrate 102 by the thermally decomposable die attach 504, a contact pad 122 of the MEMS die 116a is coupled to a contact pad 119 on the top surface 103 of the substrate 102 by a bonding wire 124. The contact pad 122 is on a top surface 107 of the MEMS die 116a that faces away from the substrate 102. The bonding wire 124 may be formed utilizing a wire bonding technique such as a wire-bond loop formation technique, a ball bonding technique, a wedge bonding technique, or any other wire bonding technique desired. The bonding wire 124 is formed to have an end coupled to the contact pad 122 on the MEMS die 116a and an end that is coupled to a contact pad 119 of the substrate 102 on the top surface 103 of the substrate 102 facing the MEMS die 116a.

The ASIC die 110 is coupled to the top surface 103 of the substrate 102 by an adhesive or coupling material 108. The adhesive or coupling material 108 is on a bottom surface 151 of the ASIC die 110. The adhesive or coupling material 108 may be a conductive adhesive, a non-conductive adhesive, or any other adhesive or coupling material 108 desired. However, the adhesive or coupling material 108 is generally not a thermally decomposable die attach, which is unlike the thermally decomposable die attach 504 utilized to couple the MEMS die 116a to the substrate 102.

Similar to the MEMS die 116a, after the ASIC die 110 is coupled to the top surface 103 of the substrate 102 by the adhesive or the coupling material 108, a contact pad 114 of the ASIC die 110 is coupled to a contact pad 117 on a top surface 103 of the substrate 102 facing the ASIC die 110 by a bonding wire 112. The contact pad 114 is on a top surface 153 of the ASIC die 110 facing away from the substrate 102. The bonding wire 112 may be formed utilizing a wire bonding technique such as a wire-bond loop formation technique, a ball bonding technique, a wedge bonding technique, or any other wire bonding technique desired. The bonding wire 112 is formed to have an end coupled to the contact pad 114 on the top surface 153 of the ASIC die 110 and an end that is coupled to a contact pad 117 on the top surface 103 of the substrate 102. The contact pad 117 on the top surface 103 of the substrate 102 coupled to the contact pad 114 by the bonding wire 112 is coupled to at least one external contact pad 121 of a plurality of external contact pads 121 on the bottom surface 101 of the substrate 102. The external contact pad 121 is coupled to external electrical components and is in electrical communication with external electrical components. Accordingly, the contact pad 114 of the ASIC die 110, the bonding wire 112, the contact pad 117 on the top surface 103 of the substrate 102, and the at least one contact pad 121 of the plurality of contact pads 121 on the bottom surface 101 of the substrate 102 allow the ASIC die 110 to electrically communicate with external electrical components outside the semiconductor package 100a.

A bonding wire 113 extends from a contact pad 111 on the top surface 153 of the ASIC die 110 to a contact pad 115 on the top surface 107 of the MEMS die 116a. The bonding wire 112 may be formed utilizing a wire bonding technique such as a wire-bond loop formation technique, a ball bonding technique, a wedge bonding technique, or any other wire bonding technique desired. However, in an alternative embodiment of a semiconductor package, the contact pad 111 of the ASIC die 110 and the contact pad 115 on the MEMS die 116a may not be present and, accordingly, the bonding wire 113 may not be present either.

Figure 4B:
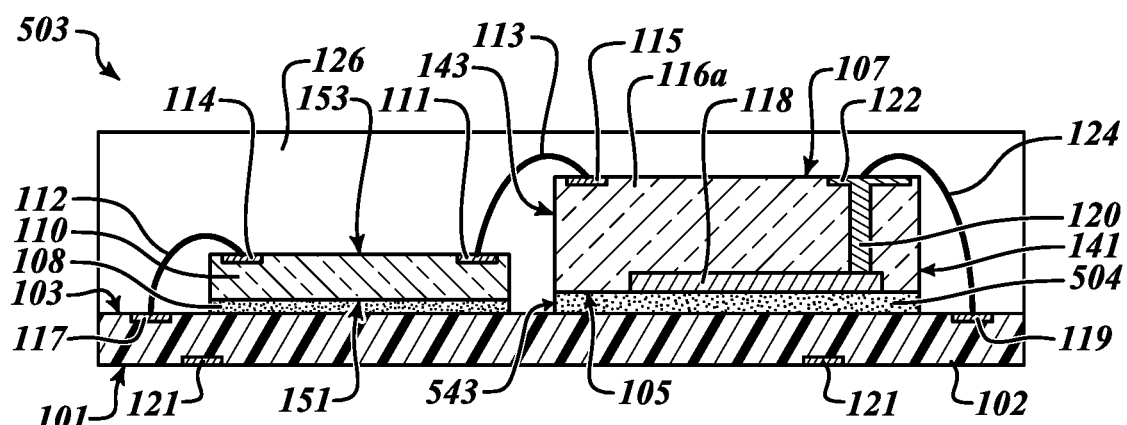

A second step 503 illustrated in FIG. 4B includes forming a molding compound 126 to surround the MEMS die 116a, the ASIC die 110, the bonding wires 112, 113, 124, the adhesive or the coupling material 108, and the thermally decomposable die attach 504. The molding compound 126 is on the top surface 103 of the substrate 102. The molding compound 126 covers and is in direct contact with the top surface 153 of the ASIC die 110 and the top surface 107 of the MEMS die 116a. The molding compound 126 covers and is in direct contact with a plurality of sidewalls 141, 143 of the MEMS die 116a, and the molding compound 126 covers and is in direct contact with a plurality of sidewalls of the ASIC die 110. The molding compound 126 may be formed utilizing injection molding, pressure and compression molding, strip molding, or any other molding compound formation technique. The molding compound 126 is formed such that the molding compound 126 will hold the MEMS die 116a in a stationary position within the semiconductor package allowing the air cavity 106 to separate the bottom surface 105 of the MEMS die 116a from the top surface 103 of the substrate 102. However, this will be discussed in greater detail later.

Figure 4C:
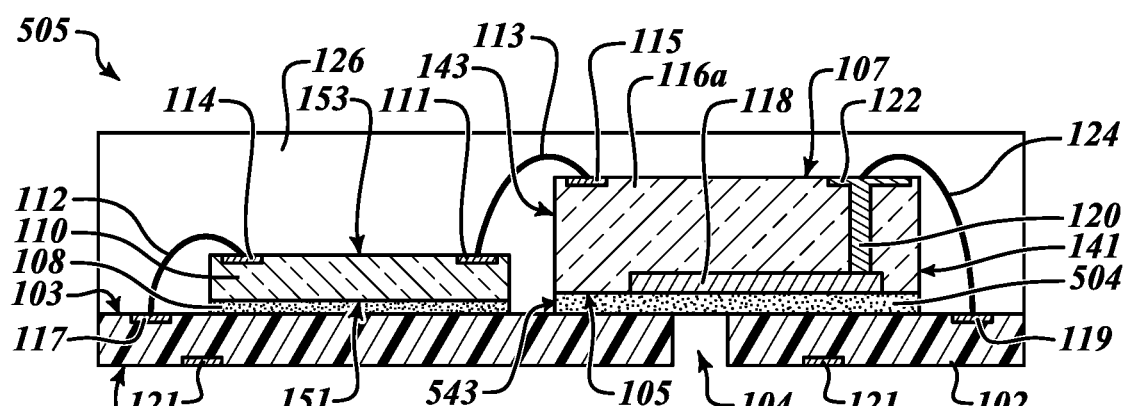

A third step 505 illustrated in FIG. 4C includes forming an opening 104 in the substrate 102. The opening 104 in the substrate 102 extends from the bottom surface 101 of the substrate 102 to the top surface 103 of the substrate 102. The opening 104 exposes the thermally decomposable die attach 504 that couples the MEMS die 116a to the substrate 102. The opening 104 is formed in the substrate 102 by removing a portion of the substrate 102 that is aligned with the sensor element 118 of the MEMS die 116a. The portion of the substrate 102 that is removed to form the opening 104 may be removed utilizing a laser drilling technique, a cutting technique, an etching technique, or some other type of removal technique as desired. However, in the preferred embodiment of the third step 505, a laser drilling technique is utilized to form the opening 104. When forming the opening 104 utilizing the laser drilling technique, a portion of the thermally decomposable die attach 504 may be removed as well, due to the heat of the laser when forming the opening 104 in the substrate 102 to expose the thermally decomposable die attach 504. The opening 104 is formed in the substrate 102 to eventually be utilized to expose the air cavity 106, which is aligned with the sensor element 118, and the sensor element 118 to an external environment of the semiconductor package 100a. However, this will be discussed in greater detail later.

Figure 4D:
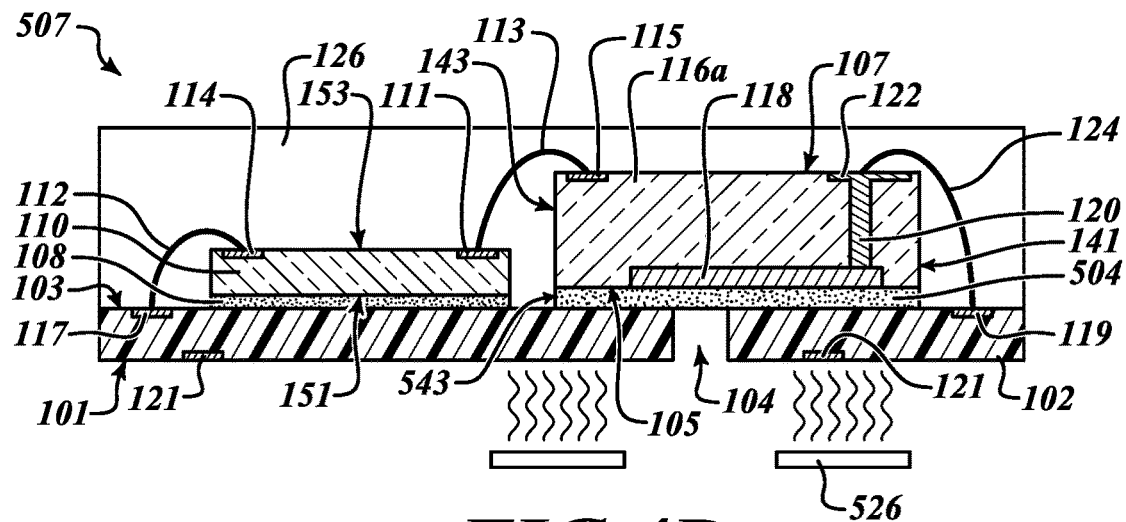

In an alternative embodiment, the third step 505 in FIG. 4D may be completed before coupling the MEMS die 116a to the substrate 102. However, in that case, the MEMS die 116a should be thick enough such that when the molding compound 126 is later formed to cover the MEMS die 116a, the MEMS die 116a is thick enough to resist a pressure applied to the MEMS die 116a when the molding compound 126 is formed. Otherwise, if the MEMS die 116a is not thick enough in this alternative method, the MEMS die 116a may be cracked when the molding compound 126 is formed on the MEMS die 116a. Accordingly, the preferred embodiment is forming the opening 104 in the substrate 102 aligned with the MEMS die 116a after the MEMS die 116a and the molding compound 126 are formed on the substrate 102.

Figure 4E:
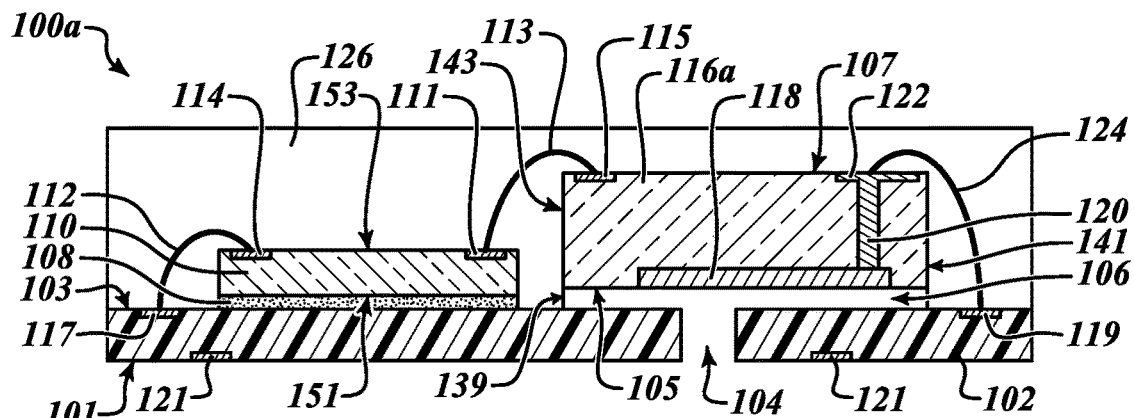

A fourth step 507 illustrated in FIG. 4E includes exposing the thermally decomposable die attach 504 to heat. The opening 104 formed in the third step is utilized to expose the thermally decomposable die attach 504 to heat produced by a heat source 526. The heat source 526 may be a light heat source, a reflow oven, or any other heat source desired. However, the preferred option in this case is to utilize a reflow oven as the heat source 526. A reflow oven generally appropriately heats semiconductor packages present within the reflow oven without harming or damaging other active and passive components within the semiconductor package. A reflow oven is also beneficial as it may be used in the formation of reflow of a solder material to form solder connections within a semiconductor package.

As discussed earlier in the description of FIG. 4A, the thermally decomposable die attach 504 may be several materials that can be decomposed with a temperature or heat produced by the heat source 526. For example, generally, the reflow oven is used to produce a temperature between 240-260° C. to decompose the thermally decomposable die attach 504. However, in alternative embodiments of this method, the heat source 526 may produce temperatures greater than or less than the range of temperatures between 240-260° C. The length of time that the semiconductor package and the thermally conductive adhesive 504 are exposed to the temperature provided by the reflow oven or heat source 526 will depend on the size of the overall semiconductor package, the amount of thermally decomposable die attach 504, the type of dies that are present within the semiconductor package, as well as several other factors.

FIG. 4E is directed to a completed semiconductor package 100a after the thermally decomposable die attach 504 is decomposed by exposure to heat. By removing the thermally decomposable die attach 504 in the fourth step 507, the air cavity 106, which is positioned between the MEMS die 116a and the substrate 102, is formed. The air cavity 106 separates the substrate 102 from the MEMS die 116a such that the MEMS die 116a is physically separate from the substrate 102.

While the following discussion is directed to the semiconductor package 100a in FIG. 1A for simplicity and brevity, the following discussion also applies to the alternative embodiments of the semiconductor package 100b, 100c, 200a, 200b, 400 in FIGS. 1B-1C, 2A-2B, and 3.

As discussed earlier, the thermally decomposable die attach 504 is utilized to form the air cavity 106. This thermally decomposable die attach 504 allows the air cavity 106 to be formed between MEMS die 116a and the substrate 102 after the molding compound 126 has been formed on the MEMS die 116a, the ASIC die 110, and the substrate 102. By removing the thermally decomposable die attach 504 after the molding compound 126 is formed, no cap is required to be coupled to the substrate 102 to protect the MEMS die 116a and the ASIC 110 on the substrate 102. Instead, the molding compound 116a protects the ASIC die 110 and the MEMS die 116a from external stresses and forces that may cause failure in the ASIC die 110 and the MEMS die 116a. By removing the necessity of a cap to protect the ASIC die 110 and the MEMS die 116a, the cost of manufacturing materials is decreased because no caps are needed to form a semiconductor package and no high-precision machines and tools need to be utilized to couple the cap to the substrate 102. The yield of usable packages formed by this method is increased as well because coupling a cap to the substrate 102 to protect the ASIC die 110 and the MEMS die 116a requires high precision tools and high precision accuracy. Accordingly, by removing the need of this high precision process to place the cap, the tolerances to form a semiconductor package are much more lenient and tolerant than compared to high precision tolerances when positioning a cap on the semiconductor package. In other words, when a cap is utilized to protect a semiconductor die and to form a semiconductor package, alignment issues of the cap occur frequently when the cap is being coupled to a substrate to protect a die of a semiconductor package.

By utilizing the molding compound 126 and thermally decomposable die attach 504 to form the semiconductor package 100a, the semiconductor package 100a can be made even thinner. The semiconductor package 100a can be made thinner because clearance between the bonding wires 113, 124 and a surface of the molding compound 126 facing away from the substrate 102 is less than when a cap is utilized to protect the components of the semiconductor package. Accordingly, a semiconductor package can be manufactured thinner than a semiconductor package when utilizing a cap to protect a MEMS die and an ASIC die.

In an alternative embodiment, a molding compound 224 can be made flush with a surface of the MEMS die in a semiconductor package 200a. For example, as illustrated in FIG. 2A, the molding compound 224 in the semiconductor package 200a is flush with the top surface 207 of the MEMS die 216 facing away from the substrate 202.

By utilizing the molding compound 126 and thermally decomposable die attach 504 to form the molding compound 126 to protect the MEMS die 116a and the ASIC die 110 less steps are required to form a completed package, and the lead time is reduced to manufacture a completed semiconductor package 100a. The lead time is reduced because coupling a cap to the substrate 102 in the correct position to protect the MEMS die 116a and the ASIC die 110 is a high precision process, and because this is a high precision process, this is a relatively time-insensitive process as well. By removing the need of the cap, several steps can be removed from a method of manufacturing when a cap is not needed to form the semiconductor package 100a. For example, no adhesive needs to be placed or formed to couple the cap to the substrate 102, the cap does not need to be placed, and high precision placement tools do not need to be utilized to form the semiconductor package 100a. Instead, utilizing the molding compound 126 to cover the MEMS die 116a and the ASIC die 110, which protects the MEMS die 116a and the ASIC die 110, the lead time for producing the semiconductor package 100a can be reduced significantly because a cap does not need to be placed on each individual ASIC die 110 and the MEMS die 116a.

Figure 5:
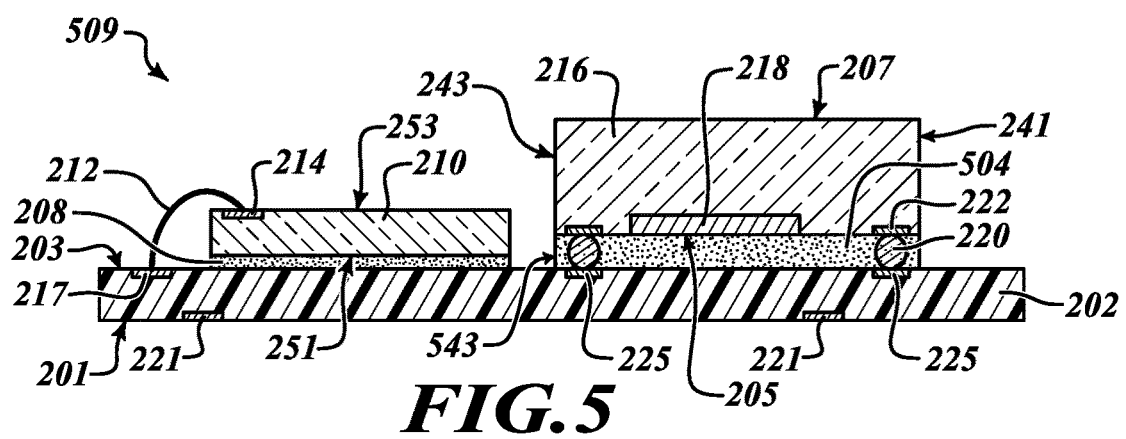
FIG. 5 is directed to a method of manufacturing an alternative embodiment of a semiconductor package containing a MEMS die and an ASIC die.

FIG. 5 is directed to a step 509 in a method of forming the semiconductor packages 200a, 200b in FIGS. 2A-2B. In this method of forming the semiconductor packages 200a, 200b, the method is similar to the method of forming the semiconductor package 100a in FIGS. 4A-4E. However, unlike the method of forming the semiconductor package 100a in FIGS. 4A-4E, no bonding wires are coupled to a MEMS die 216 in the semiconductor packages 200a, 200b. While the following discussion applies to both the semiconductor package 200a, 200b in FIGS. 2A-2B, the following discussion will only reference the semiconductor package 200a in FIG. 2A for simplicity and brevity, and will only discuss differences when in view of the method of forming the semiconductor package 100a in FIG. 1A as discussed earlier.

The first step 509 of this method of forming the semiconductor package 200a is illustrated in FIG. 5. In this method, a plurality of solder balls 220 are coupled to a plurality of contact pads 222 that are on the bottom surface 205 of the MEMS die 216 that has a sensor element 218 and faces the substrate 202. Each respective solder ball 220 of the plurality of solder balls 220 is aligned with a respective contact pad 225 of a plurality of contact pads 225 on the top surface 203 of the substrate 202 facing the MEMS die 216. The plurality of solder balls 220 are surrounded by the thermally decomposable die attach or material 504 that couples the MEMS die 216 to the substrate 202. The plurality of solder balls 220 are in contact with the plurality of contact pads 225. However, in alternative embodiments of this method, a portion of the thermally decomposable die attach 504 may separate each respective solder ball 220 of the plurality of solder balls 220 from the plurality of contact pads 225 on the substrate 202. The first step 501 illustrated in FIG. 4B may be utilized to form semiconductor packages 200a, 200b as illustrated in FIGS. 2A-2B.

When forming the air cavity 206 in FIGS. 2A-2B, the thermally decomposable die attach 504 on the bottom surface 205 of the MEMS die 216 has sidewalls 543 that are flush with the sidewalls 241, 243 of the MEMS die 216. In an alternative embodiment, the sidewalls 543 of the thermally decomposable die attach 504 may extend outwardly from the sidewalls 241, 243 of the MEMS die 216, which means that the width of the thermally decomposable die attach 504 is greater than the width of the MEMS die 216. Alternatively, in another alternative embodiment, the sidewalls 543 of the thermally decomposable die attach 504 may extend inwardly from the sidewalls 241, 243 of the MEMS die 216, which means that the width of the thermally decomposable die attach 504 is less than the width of the MEMS die 216.

Alternatively, when alternative first step 509 in FIG. 5 is utilized in this process, the thermally decomposable die attach 504 is exposed to a heat from a heat source 526, which may be a reflow oven, to remove the thermally decomposable die attach 504 to form the air cavity 206. The heat from the heat source 526 causes the plurality of solder balls 220 to reflow at the same time the thermally decomposable material 504 is decomposed and removed. As the plurality of solder balls 220 are reflowed by the heat from the heat source 526, the plurality of solder balls 220 couple the plurality of contact pads 225 on the top surface 203 of the substrate 202 to the plurality of contact pads 222 on the bottom surface 205 of the MEMS die 216. This forms an electrical connection between the MEMS die 216 and the substrate 202. The completion of this reflow of the plurality of solder balls 220 can be seen in FIGS. 2A-2B as discussed earlier. Also, the solder balls 220 could be replaced by other known conductive connectors, such as pins and conductive adhesives that may initially be present in the thermally decomposable die attach 504.

Figure 6:
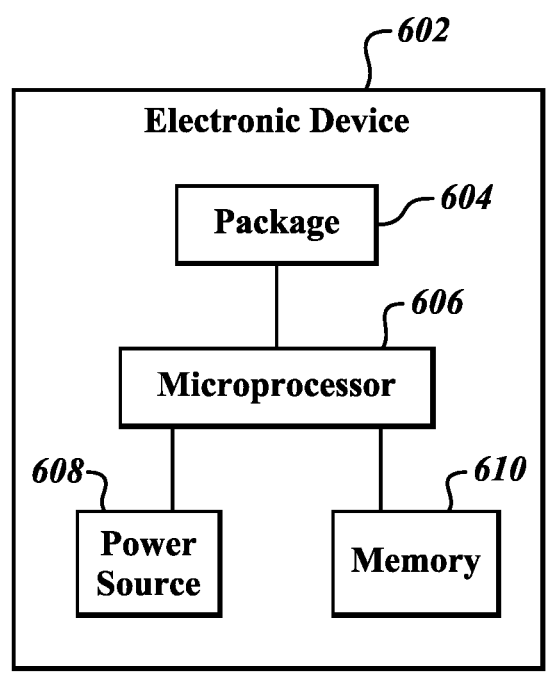
FIG. 6 is directed to an embodiment of an electronic device that contains an embodiment of a semiconductor package containing a MEMS die and an ASIC die.

FIG. 6 is directed to an electronic device 602 that includes a semiconductor package 604. The semiconductor package 604 is based on the embodiments discussed above in FIGS. 1A-3 or a semiconductor package within the scope of FIGS. 1A-3 and is manufactured utilizing a manufacturing method disclosed in FIGS. 4A-4F or a method within the scope of FIGS. 4A-4F.

In the electronic device 602, the semiconductor package 604 is electrically coupled to a microprocessor 606 that is within the electronic device 602. The microprocessor 606 sends electrical signals to the semiconductor package 604 and the microprocessor 606 receives electrical signals from the semiconductor package 604. For example, the microprocessor 606 may transmit power signals, command signals, or any other signals to control or power the semiconductor package 604. Conversely, the semiconductor package 604 may transmit data signals, information signals, or any other signals to provide feedback, data, or information to the microprocessor 606 utilized to control the electronic device 602. The semiconductor package 604 and the microprocessor 606 may be coupled by electrical connections such as a wire, an conductive via, a PCB, or any other electrical connection as desired. For example, in relation to the semiconductor package in FIG. 1A, the ASIC die 110 receives and transmits power and electrical signals from and to the power source 608, the microprocessor 606, and the memory 610 that the substrate 102 is in electrical communication. Because the ASIC die 110 is coupled to the substrate 102, the ASIC die 110 is in electrical communication with the power source 608, the microprocessor 606, and the memory 610.

The microprocessor 606 is coupled to a power source 608. The microprocessor 606 directs and controls where power from the power source is supplied. For example, the microprocessor 606 controls and transmits a percentage of power from the power supply to the semiconductor package, controls and transmits another percentage of power to a touch display of the electronic device, and controls and transmits the amount of power supplied to each electrical component within the electronic device 602.

The microprocessor 606 is coupled to a memory 610. The microprocessor 606 sends data or information to the memory 610 for storage. For example, the microprocessor 606 may transmit data or information signals received from the semiconductor package 604 to the memory 610 for storage. Alternatively, the microprocessor 606 may transmit any other data or information signals from any other electronic component within the electronic device to which the microprocessor 606 is coupled.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a substrate including a first surface, a second surface facing away from the first surface, and an opening that extends through the substrate from the first surface to the second surface;
 a micro-electromechanical system (MEMS) die aligned with the opening, the MEMS die being spaced apart from the second surface of the substrate by a cavity, the MEMS die overlapping the opening in the substrate, and the MEMS die including:

a third surface facing the second surface of the substrate, the cavity extending from the third surface of the MEMS die to the second surface of the substrate; and a plurality of sidewalls transverse to the third surface;

an ASIC die coupled to the second surface of the substrate, the ASIC die including a sidewall spaced laterally apart from the MEMS die;

a space between the ASIC die and the MEMS die separating the sidewall of the ASIC die from the MEMS die; and a molding compound covering the plurality of sidewalls of the MEMS die and defining sides of the cavity and covering the sidewall of the ASIC die and filling the space between the ASIC die and the MEMS die, and the MEMS die being within the molding compound overlapping the cavity and spaced apart from the second surface of the substrate by the cavity.

2. The device of claim 1, further comprising:
an adhesive coupling the ASIC die to the second surface of the substrate; and
a bonding wire coupling the ASIC die to the MEMS die.

3. The device of claim 1, wherein:
the MEMS die further comprises a fourth surface facing away from the second surface of the substrate; and
the molding compound further comprises a fifth surface facing away from the second surface of the substrate that is co-planar with the fourth surface.

4. The device of claim 1,
wherein the cavity is empty.

5. The device of claim 1, wherein the MEMS die further comprises:
a plurality of first contact pads on the third surface of the MEMS die;
a plurality of second contact pads on the second surface of the substrate; and
a plurality of solder balls coupled between the plurality of first contact pads on the MEMS die and the plurality of second contact pads on the substrate, the plurality of solder balls positioned within the cavity a distance away from the sides of the cavity.

6. A device, comprising:
a substrate with an opening that extends through the substrate from a first surface of the substrate to a second surface of the substrate;
a micro-electromechanical system (MEMS) die aligned with the opening, the MEMS die including a sensor component aligned with the opening in the substrate and a plurality of sidewalls transverse to the first surface of the substrate and the second surface of the substrate;
a cavity in fluid communication and aligned with the opening and the sensor component, the cavity separating the MEMS die from the substrate and extending from the substrate to the MEMS die; and
an encapsulant around the MEMS die and including sidewalls defining sides of the cavity, and the sidewalls of the encapsulant are respectively aligned with the sidewalls of the MEMS die.

7. The device of claim 6, wherein sidewalls of the encapsulant each include first and second portions, the first portions respectively contacting the sidewalls of the MEMS die and the second portions defining the sides of the cavity.

8. The device of claim 7, further comprising:
an adhesive layer;

an application specific integrated circuit (ASIC) die coupled to a surface of the MEMS die by the adhesive layer; and
a bonding wire electrically coupling the ASIC die to the substrate.

9. The device of claim 6, further comprising:
an adhesive layer;
an application specific integrated circuit (ASIC) coupled to the substrate by the adhesive layer; and
a bonding wire electrically coupling the ASIC to the substrate.

10. The device of claim 9, further comprising a bonding wire coupling the MEMS die to the ASIC.

11. The device of claim 6, wherein the cavity has a width greater than a width of the opening, and the cavity has a height that is less than the height of the opening.

12. The device of claim 6, wherein the MEMS die further comprises:
a plurality of contact pads adjacent to the sensor component of the MEMS die; and
a plurality of solder balls coupled between the plurality of contact pads of the MEMS die and the substrate, the plurality of solder balls positioned within the cavity a distance away from the sides of the cavity.

13. The device of claim 12, wherein:
the encapsulant includes a first surface facing away from the substrate; and
the MEMS die includes a second surface facing away from the substrate that is coplanar with the first surface of the encapsulant.

14. A device, comprising:
a substrate including a first surface, a second surface opposite to the first surface, and an opening that extends through the substrate from the first surface to the second surface;
a micro-electromechanical system (MEMS) die overlaps that opening, the MEMS die including a sensor component and a plurality of sidewalls transverse to the first surface of the substrate;
a cavity overlaps the opening, is in fluid communication with the opening and the sensor component of the MEMS die, is between the MEMS die and the first surface of the substrate, and separates the MEMS die from the substrate and extends from the first surface of the substrate to the MEMS die; and
a molding compound covers the first surface of the substrate, covers the plurality of sidewalls of the MEMS die, and defines a plurality of sidewalls of the cavity, the plurality of sidewalls of the cavity are coplanar with the plurality of sidewalls of the MEMS die.

15. The device of claim 14, wherein the MEMS die further includes a cap that at least partially delimits the cavity that overlaps the opening, and the cap includes a plurality of cap sidewalls coplanar with the plurality of sidewalls of the cavity.

16. The device of claim 14, further comprising an application-specific integrated circuit (ASIC) die on the first surface of the substrate, and wherein the molding compound covers the ASIC die.

17. The device of claim 16, wherein the ASIC die is electrically coupled to the MEMS die.

18. The device of claim 17, further comprising a bonding wire having a first end coupled to the ASIC die and a second end coupled to the MEMS die.

19. The device of claim 14, wherein the MEMS die further includes:

a die portion including the sensing component; and a cap coupled to the die portion, that covers the sensing component of the sensor component, and that includes an opening that extends through the cap to a cavity delimited by the cap.

20. The device of claim 19, wherein the cavity delimited by the cap is in fluid communication with the cavity between the MEMS die and the first surface of the substrate through the opening in the cap.

21. The device of claim 1, wherein the cavity is in direct fluid communication with the opening in the substrate.

* * * * *